(12) United States Patent
Xiao et al.

(10) Patent No.: US 9,793,005 B2
(45) Date of Patent: Oct. 17, 2017

(54) SHIFT REGISTER UNIT, GATE DRIVE CIRCUIT, AND DISPLAY DEVICE

(71) Applicant: EVERDISPLAY OPTRONICS (SHANGHAI) LIMITED, Shanghai (CN)

(72) Inventors: Lina Xiao, Shanghai (CN); Ying-Hsiang Tseng, Shanghai (CN)

(73) Assignee: EverDisplay Optronics (Shanghai) Limited, Sanghai (CN)

(*) Notice: Subject to any disclaimer, the term of this patent is extended or adjusted under 35 U.S.C. 154(b) by 21 days.

(21) Appl. No.: 15/163,974

(22) Filed: May 25, 2016

(65) Prior Publication Data
US 2017/0221578 A1    Aug. 3, 2017

(30) Foreign Application Priority Data
Jan. 29, 2016    (CN) .......................... 2016 1 0065712

(51) Int. Cl.
*G11C 19/28*        (2006.01)
*G09G 3/20*         (2006.01)

(52) U.S. Cl.
CPC .......... *G11C 19/28* (2013.01); *G09G 3/2092* (2013.01); *G09G 2300/08* (2013.01); *G09G 2310/0267* (2013.01); *G09G 2310/0286* (2013.01); *G09G 2310/08* (2013.01); *G09G 2330/02* (2013.01)

(58) Field of Classification Search
CPC .... G11C 19/28; G09G 3/3674–3/3692; G09G 2310/0267–2310/0275; G09G 2310/0286
USPC ................................ 345/98, 100; 377/64–81
See application file for complete search history.

(56) References Cited

U.S. PATENT DOCUMENTS

| 7,688,934 B2* | 3/2010 | Tsai | G11C 19/28 377/64 |
| 2010/0156474 A1* | 6/2010 | Park | G09G 3/3677 327/108 |
| 2010/0158188 A1* | 6/2010 | Lee | G09G 3/3677 377/79 |
| 2010/0277206 A1* | 11/2010 | Lee | G09G 3/3677 327/108 |

* cited by examiner

*Primary Examiner* — Michael Pervan
(74) *Attorney, Agent, or Firm* — Yunling Ren

(57) ABSTRACT

The present disclosure discloses a shift register unit, a gate drive circuit, and a display device. The shift register unit includes first to twelfth switch elements, a first capacitor, and a second capacitor. The first switch element switches on in response to an input signal, the second switch element switches on in response to a first clock signal, the third, the ninth and the twelfth switch elements switch on in response to a signal of the second node, the fourth switch element switches on in response to a signal of the first node, and the fifth, the seventh and the eleventh switch elements switch on in response to a second clock signal.

11 Claims, 15 Drawing Sheets

SHIFT REGISTER UNIT, GATE DRIVE CIRCUIT, AND DISPLAY DEVICE

CROSS REFERENCE

This application is based upon and claims priority to Chinese Patent Application No. 201610065712.0, filed on Jan. 29, 2016, the entire contents thereof are incorporated herein by reference.

TECHNICAL FIELD

The present disclosure relates to the field of display technologies, and in particular, to a shift register unit, a gate drive circuit and a display device.

BACKGROUND

A display device not only includes a display panel, but also includes a gate drive circuit (also referred to as a row drive circuit) for controlling display on the display panel having a pixel array, and a source drive circuit (also referred to as a column drive circuit). The display panel employs a display mode of row-by-row scanning. The gate drive circuit is configured to generate scanning signals, such that each row of pixels are successively conducted. The source drive circuit is configured to provide, when a row of pixels are conducted, data signals to the row of pixels such that the display of the pixels is implemented.

The gate drive circuit includes a shift register. The shift register includes a plurality of cascaded shift register units, wherein each cascaded shift register unit is mainly formed of several transistors. A clock signal "CLK" and an input signal "in" (that is, a start pulse signal) are input to the circuit, and an electrical level signal (that is, "out" signal) is output at an output terminal.

However, in the prior art, there is no such a shift register unit which is capable of effectively and stably outputting the "out" signal.

SUMMARY

In view of the problem in the prior art, the present invention is intended to provide a shift register unit, a gate drive circuit and a display device, to solve the technical problem in the prior art that the shift register fails to effectively and stably output the "out" signal.

To achieve the above objective, some embodiments of the present invention provide a shift register unit, including:

a first switch element, configured to switch on in response to an input signal to provide a first clock signal to a first node;

a second switch element, configured to switch on in response to the first clock signal to provide a first power signal to the first node;

a third switch element, coupled to a second node, and configured to switch on in response to a voltage signal of the second node to provide a second power signal to a third node;

a fourth switch element, coupled to the first node, and configured to switch on in response to a voltage signal of the first node;

a fifth switch element, configured to switch on in response to a second clock signal, and coupled to the fourth switch element;

a sixth switch element, coupled to a fourth node, and configured to switch on in response to a voltage signal of the fourth node to provide the second power signal to the second node;

a seventh switch element, configured to switch on in response to the second clock signal to provide the input signal to the second node;

an eighth switch element, coupled to the third node, and configured to switch on in response to a voltage signal of the third node to provide the first clock signal to the fourth node;

a ninth switch element, coupled to the second node, and configured to switch on in response to the voltage signal of the second node to provide the second power signal to the fourth node;

a tenth switch element, coupled to the fourth node, and configured to switch on in response to the voltage signal of the fourth node to provide the second power signal to an output terminal;

an eleventh switch element, configured to switch on in response to the second clock signal to provide the second power signal to the output terminal;

a twelfth switch element, coupled to the second node, and configured to switch on in response to the voltage signal of the second node to provide the first clock signal to the output terminal;

a first capacitor, coupled between the second power signal and the fourth node; and a second capacitor, coupled between the second node and the output terminal.

In another embodiment of the present invention, the first to twelfth switch elements are respectively first to twelfth transistors.

In another embodiment of the present invention, each of the first to twelfth transistors has a control terminal, a first terminal and a second terminal;

the control terminal of the first transistor is configured to receive the input signal, the first terminal of the first transistor is configured to receive the first clock signal, and the second terminal of the first transistor is coupled to the first node;

the control terminal of the second transistor is configured to receive the first clock signal, the first terminal of the second transistor is coupled to the second terminal of the first transistor, and the second terminal of the second transistor is configured to receive the first power signal;

the control terminal of the third transistor is coupled to the second node, the first terminal of the third transistor is configured to receive the second power signal, and the second terminal of the third transistor is coupled to the third node;

the control terminal of the fourth transistor is coupled to the first node, and the first terminal of the fourth transistor is coupled to the third node;

the control terminal of the fifth transistor and the second terminal of the fifth transistor are both configured to receive the second clock signal, and the first terminal of the fifth transistor is coupled to the second terminal of the fourth transistor;

the control terminal of the sixth transistor is coupled to the fourth node, the first terminal of the sixth transistor is configured to receive the second power signal, and the second terminal of the sixth transistor is coupled to the second node;

the control terminal of the seventh transistor is configured to receive the second clock signal, the first terminal of the seventh transistor is coupled to the second node, and the second terminal of the seventh transistor is configured to receive the input signal;

the control terminal of the eighth transistor is coupled to the third node, the first terminal of the eighth transistor is coupled to the first clock signal, and the second terminal of the eighth transistor is coupled to the fourth node;

the control terminal of the ninth transistor is coupled to the second node, the first terminal of the ninth transistor is configured to receive the second power signal, and the second terminal of the ninth transistor is coupled to the fourth node;

the control terminal of the tenth transistor is coupled to the fourth node, the first terminal of the tenth transistor is configured to receive the second power signal, and the second terminal of the tenth transistor is coupled to the output terminal;

the control terminal of the eleventh transistor is configured to receive the second clock signal, the first terminal of the eleventh transistor is configured to receive the second power signal, and the second terminal of the eleventh transistor is coupled to the output terminal; and the control terminal of the twelfth transistor is coupled to the second node, the first terminal of the twelfth transistor is coupled to the output terminal, and the second terminal of the twelfth transistor is configured to receive the first clock signal.

In another embodiment of the present invention, the first to twelfth transistors are PMOS transistors.

In another embodiment of the present invention, the first clock signal and the second clock signal have the same cycle but have opposite phases.

In another embodiment of the present invention, the first power signal is of a low level, and the second power signal is of a high level.

In another embodiment of the present invention, the input signal is a start pulse signal with a low electric level.

To achieve the above objective, some other embodiments of the present invention provide a gate drive circuit, which includes a plurality of shift register units as described above.

In another embodiment of the present invention, the plurality of shift register units are electrically coupled in a cascading manner, wherein an input terminal of a first-level shift register unit is configured to receive a start pulse signal, and a signal of an output terminal of each of the remaining levels of shift register units except for the last-level shift register unit is coupled to an input terminal of a next-level shift register unit.

To achieve the above objective, some other embodiments of the present invention provide a display device, which includes a gate drive circuit as described above.

The beneficial effects of the present invention are: by improvements on the circuit structure of the traditional shift register unit, including changing the number of switch elements contained in the circuit and the connections therebetween, each of the switch elements in the circuit is switched on or switched off according to a signal of its control terminal, such that the output signals are controlled. In this way, the signals can be effectively and stably output to a next-level shift register unit, and finally a stable signal waveform is provided.

BRIEF DESCRIPTION OF THE DRAWINGS

Exemplary embodiments of the present disclosure will be described in detail with reference to the accompanying drawings, such that the above features and other features and advantages of the present disclosure will become more apparent.

REFERENCE SIGNS ARE LISTED AS BELOW

S1-S12: first switch element to twelfth switch element
T1-T12: first transistor to twelfth transistor
C1: first capacitor
C2: second capacitor
CK1: first clock signal
CK2: second clock signal
VEE: first power voltage
VDD: second power voltage
STV/in: start pulse signal/input signal
n1: first node
n2: second node
n3: third node
n4: fourth node
SR1: first-level shift register unit
SR2: second-level shift register unit
SR3: third-level shift register unit
SR4: fourth-level shift register unit
SR5: fifth-level shift register unit

DETAILED DESCRIPTION

Typical embodiments embodying the features and advantages of the present disclosure will be described in detail hereinafter. It should be understood that various variations may be made to the present invention based on different embodiments, which are all derived without departing from the scope of the present disclosure. In addition, the description and accompanying drawings are essentially for illustration purpose only, rather than limiting the present invention.

To solve the aforesaid technical problem, several embodiments are given hereinafter to further explain and describe the present invention.

Embodiment 1

Figure 1:
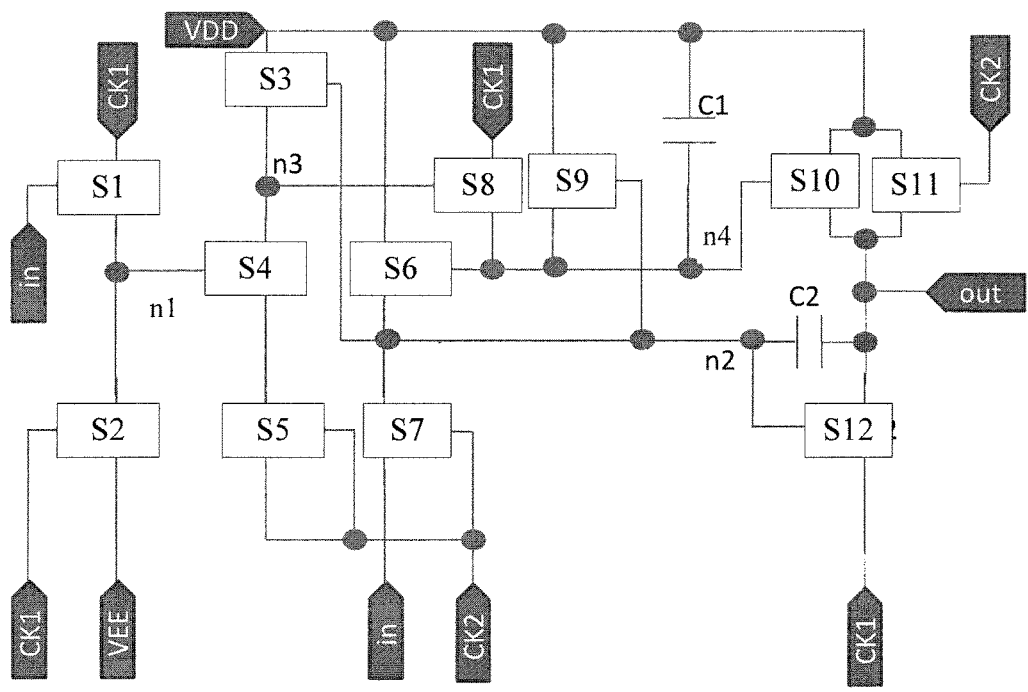
FIG. 1 is a schematic constructional diagram of a shift register unit according to Embodiment 1 of the present disclosure.

As illustrated in FIG. 1, this embodiment provides a shift register unit, including: a first switch element S1, a second switch element S2, a third switch element S3, a fourth switch element S4, a fifth switch element S5, a sixth switch element S6, a seventh switch element S7, an eighth switch element S8, a ninth switch element S9, a tenth switch element S10, an eleventh switch element S11, a twelfth switch element S12, a first capacitor C1 and a second capacitor C2.

In this embodiment, the first switch element S1 is configured to switch on in response to an input signal "in" to provide a first clock signal CK1 to a first node n1; the second switch element S2 is configured to switch on in response to the first clock signal CK1 to provide a first power signal VEE to the first node n1; the third switch element S3 is coupled to a second node n2, and configured to switch on in response to a voltage signal of the second node n2 to provide a second power signal VDD to a third node n3; the fourth switch element S4 is coupled to the first node n1, and configured to switch on in response to a voltage signal of the first node n1; the fifth switch element S5 is configured to switch on in response to a second clock signal CK2, and is coupled to the fourth switch element; the sixth switch element S6 is coupled to a fourth node n4, and configured to switch on in response to a voltage signal of the fourth node n4 to provide the second power signal VDD to the second node n2; the seventh switch element S7 is configured to switch on in response to the second clock signal CK2 to provide the input signal "in" to the second node n2; the eighth switch element S8 is coupled to the third node n3, and configured to switch on in response to a voltage signal of the third node n3 to provide the first clock signal CK1 to the fourth node n4; the ninth switch element S9 is coupled to the second node n2, and configured to switch on in response to the voltage signal of the second node n2 to provide the second power signal VDD to the fourth node n4; the tenth switch element S10 is coupled to the fourth node n4, and configured to switch on in response to a signal of the fourth node n4 to provide the second power signal VDD to an output terminal "out"; the eleventh switch element S11 is configured to switch on in response to the second clock signal CK2 to provide the second power signal VDD to the output terminal "out"; and the twelfth switch element S12 is coupled to the second node n2, and configured to switch on in response to the voltage signal of the second node n2 to provide the first clock signal CK1 to the output terminal "out". In addition, the first capacitor C1 is coupled between the second power signal VDD and the fourth node n4; and the second capacitor C2 is coupled between the second node n2 and the output terminal "out".

In this embodiment, the first switch element S1 to twelfth switch element S12 may be switch transistors. However, in other embodiments of the present disclosure, the first switch element S1 to twelfth switch element S12 may be other type of switches, for example, BJT switches, and the like.

Hereinafter, description is given by using the case where the first switch element S1 to twelfth switch element S12 in this embodiment are all PMOS transistors as an example, and the first switch element S1 to twelfth switch element S12 respectively correspond to the first transistor T1 to twelfth transistor T12. In this embodiment, each of the first transistor T1 to twelfth transistor T12 has a control terminal, a first terminal and a second terminal, and these three terminals respectively correspond to a gate, a source and a drain of a transistor.

Figure 2:
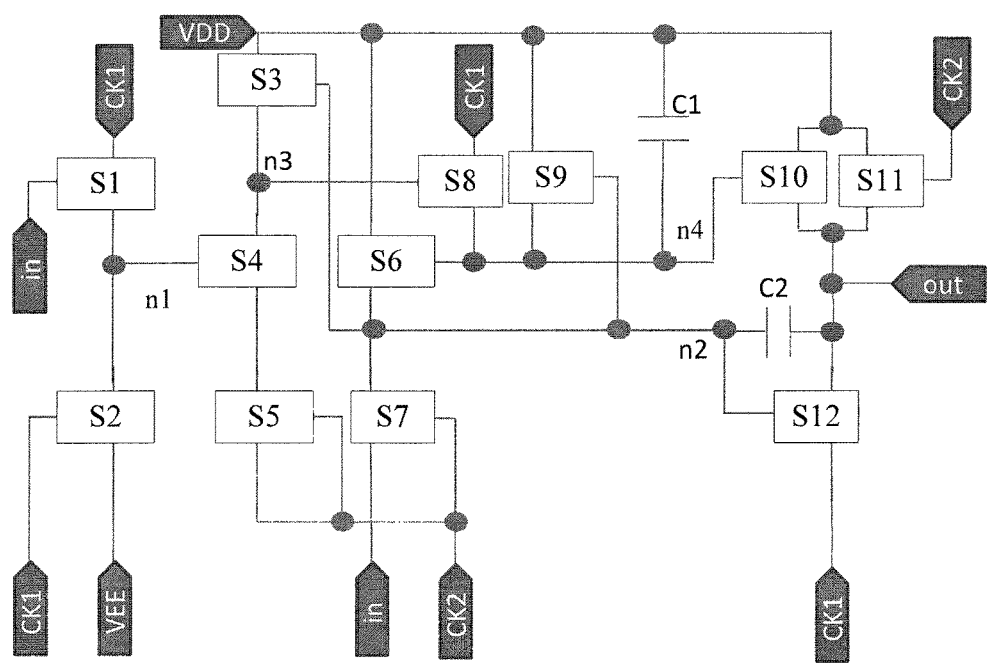
FIG. 2 is a circuit diagram of the shift register unit according to Embodiment 1 of the present disclosure.

A circuit of the shift register unit using the transistors as an example in this embodiment is as illustrated in FIG. 2, and the specific connection relationships are given below.

The control terminal of the first transistor T1 is configured to receive the input signal "in", the first terminal of the first transistor T1 is coupled to the first clock signal CK1, and the second terminal of the first transistor T1 is coupled to the first node n1; the control terminal of the second transistor T2 is configured to receive the first clock signal CK1, the first terminal of the second transistor T2 is coupled to the second terminal of the first transistor T1, and the second terminal of the second transistor T2 is configured to receive the first power signal VEE; the control terminal of the third transistor T3 is coupled to the second node n2, the first terminal of the third transistor T3 is configured to receive the second power signal VDD, and the second terminal of the third transistor T3 is coupled to the third node n3; the control terminal of the fourth transistor T4 is coupled to the first node n1, and the first terminal of the fourth transistor T4 is coupled to the third node n3; the control terminal of the fifth transistor T5 and the second terminal of the fifth transistor T5 are both configured to receive the second clock signal CK2, and the first terminal of the fifth transistor T5 is coupled to the second terminal of the fourth transistor T4; the control terminal of the sixth transistor T6 is coupled to the fourth node n4, the first terminal of the sixth transistor T6 is configured to receive the second power signal VDD, and the second terminal of the sixth transistor T6 is coupled to the second node n2; the control terminal of the seventh transistor T7 is configured to receive the second clock signal CK2, the first terminal of the seventh transistor T7 is coupled to the second node n2, and the second terminal of the seventh transistor T7 is configured to receive the input signal "in"; the control terminal of the eighth transistor T8 is coupled to the third node n3, the first terminal of the eighth transistor T8 is configured to receive the first clock signal CK1, and the second terminal of the eighth transistor T8 is coupled to the fourth node n4; the control terminal of the ninth transistor T9 is coupled to the second node n2, the first terminal of the ninth transistor T9 is configured to receive the second power signal VDD, and the second terminal of the ninth transistor T9 is coupled to the fourth node n4; the control terminal of the tenth transistor T10 is coupled to the fourth node n4, the first terminal of the tenth transistor T10 is configured to receive the second power signal VDD, and the second terminal of the tenth transistor T10 is coupled to the output terminal "out"; the control terminal of the eleventh transistor T11 is configured to receive the second clock signal CK2, the first terminal of the eleventh transistor T11 is configured to receive the second power signal VDD, and the second terminal of the eleventh transistor T11 is coupled to the output terminal "out"; and the control terminal of the twelfth transistor T12 is coupled to the second node n2, the first terminal of the twelfth transistor T12 is coupled to the out terminal "out", and the second terminal of the twelfth transistor T12 is configured to receive the first clock signal CK1.

Figure 3:
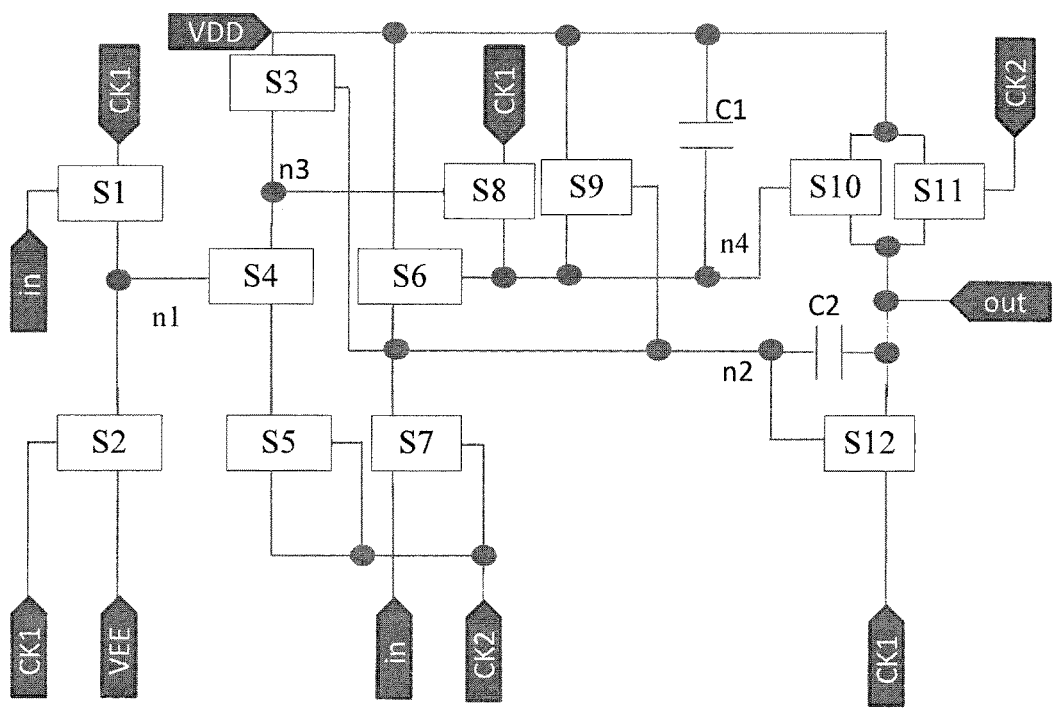
FIG. 3 is a timing waveform diagram corresponding to the circuit diagram of FIG. 2 according to Embodiment 1 of the present disclosure.

A timing waveform diagram corresponding to the circuit diagram of FIG. 2 is as illustrated in FIG. 3. The input signal "in" is a start pulse signal and is represented by STV/in. As illustrated in FIG. 3, the input signal STV/in is a pulse signal with a low electric level; the clock signals CK1 and CK2 are square wave pulses which have the same cycle as the input signal STV/in, and the clock signals CK1 and CK2 always have opposite phases with each other. When the circuit as illustrated in FIG. 2 is used, a waveform Output1 of the output signal at the output terminal "out" is illustrated in FIG. 3.

It should be further noted that in the present embodiment, the first power signal VEE is of a low level, and the second power signal VDD is of a high level.

FIG. 2 and FIG. 3 are analyzed stage by stage hereinafter.

Figure 4:
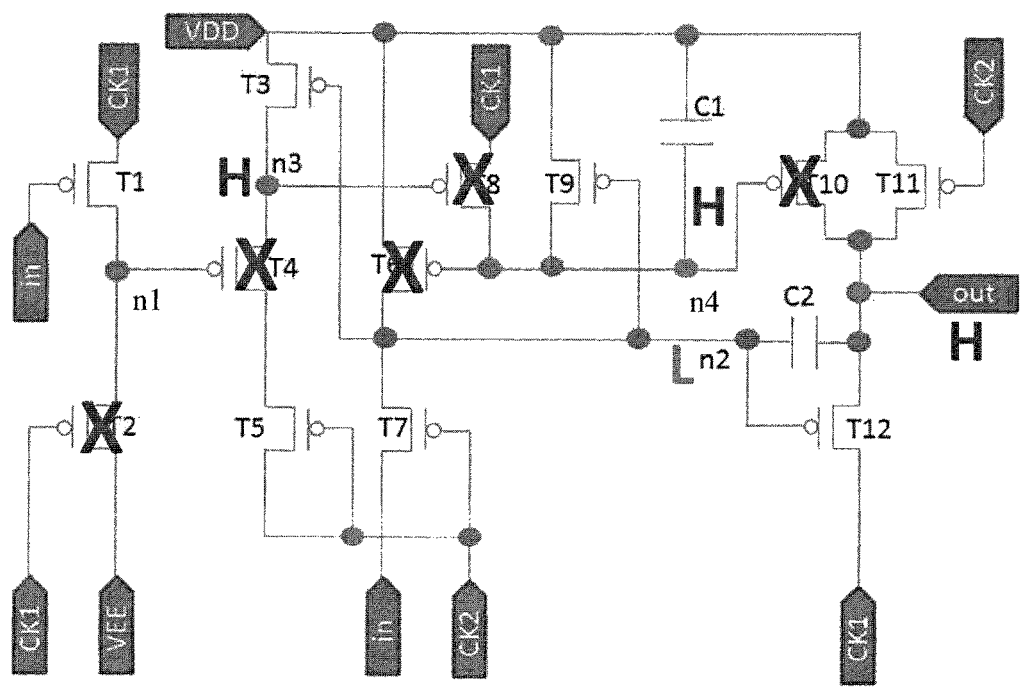
FIG. 4 is a schematic diagram of circuit working principles of the shift register unit working at a first stage according to Embodiment 1 of the present disclosure.
Figure 5:
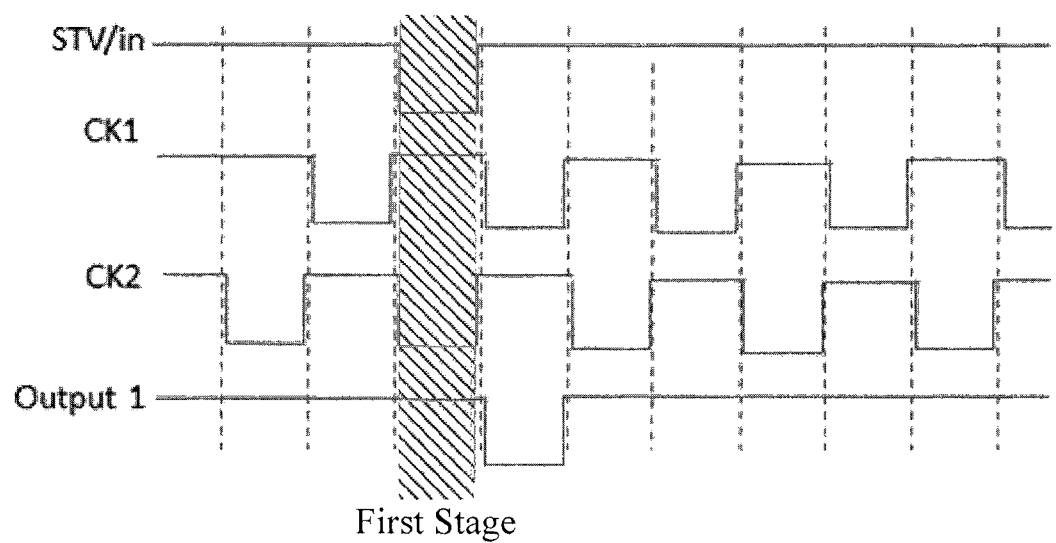
FIG. 5 is a timing waveform diagram corresponding to the circuit diagram of FIG. 4 according to Embodiment 1 of the present disclosure.

A schematic diagram of working principles of the circuit at a first stage and the corresponding timing waveform diagram are respectively illustrated in FIG. 4 and FIG. 5. Working states of the transistors in the circuit and level states (H represents a high level, and L represents a low level) of the first node n1, the second node n2, the third node n3 and the fourth node n4 are also illustrated in FIG. 4. The control terminal of T1 is configured to receive the input signal "in", and at this stage, the input signal "in" is of a low level, and T1 is switched on; the control terminal of T2 is configured to receive CK1, and at this time, CK1 is of a high level, and T2 is switched off. When T1 is switched on, the second terminal of T1 is of a high level, that is, the control terminal (i.e., the first node n1) of T4 is of a high level; and as a result, T4 is switched off. The control terminals of T5 and T7 are configured to receive CK2, and at this time, CK2 is of a low level, and T5 and T7 are switched on. At this time, the input signal "in" at the second terminal of T7 is of a low level, therefore, the first terminal of T7 (i.e., the second node n2) is of a low level (represented by L). The control terminal of T3 is coupled to the second node n2; as a result, T3 is switched on. Since the input power signal VDD at the first terminal of T3 is of a high level, when T3 is switched on, the second terminal of T3 is also of a high level, that is, the third node n3 is of a high level (represented by H). The control terminal of T9 is coupled to the second node n2 which is of a low level, thus, T9 is switched on; the first terminal of T9 is coupled to the power signal VDD which is of a high level, thus, the second terminal of T9 is also of a high level, that is, the fourth node n4 is of a high level (represented by H). When the fourth node n4 is of a high level, T8 and T10 are both switched off. The control terminal of T11 is coupled to the second clock signal CK2 which is of a low level, therefore, T11 is switched on. The first terminal of T11 is configured to receive the power signal VDD which is of a high level. The control terminal of T12 is coupled to the second node n2 which is of a low level, and thus T12 is switched on.

That is to say, at the first stage, T1, T3, T5, T7, T9, T11 and T12 are switched on; in this case, the output signal "out" is of a high level (represented by H), and the waveform Output1 is as illustrated in FIG. 5. Shadow portions in FIG. 5 correspond to levels of the input signal, the clock signals and the output signal at the first stage.

Figure 6:
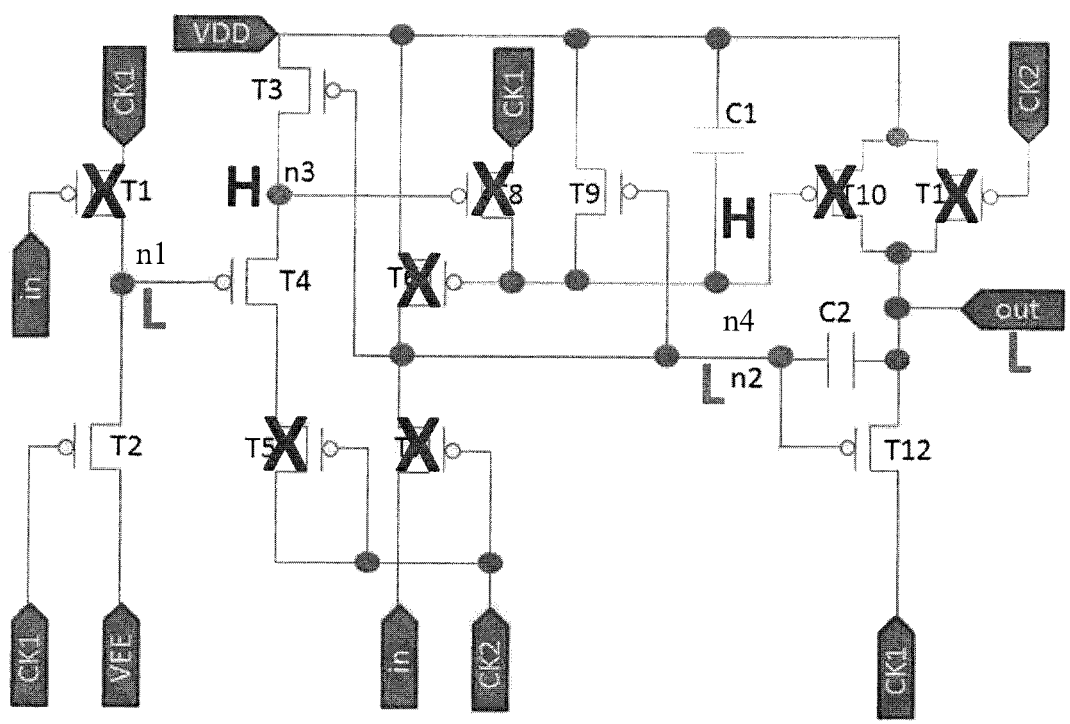
FIG. 6 is a schematic diagram of circuit working principles of the shift register unit working at a second stage according to Embodiment 1 of the present disclosure.
Figure 7:
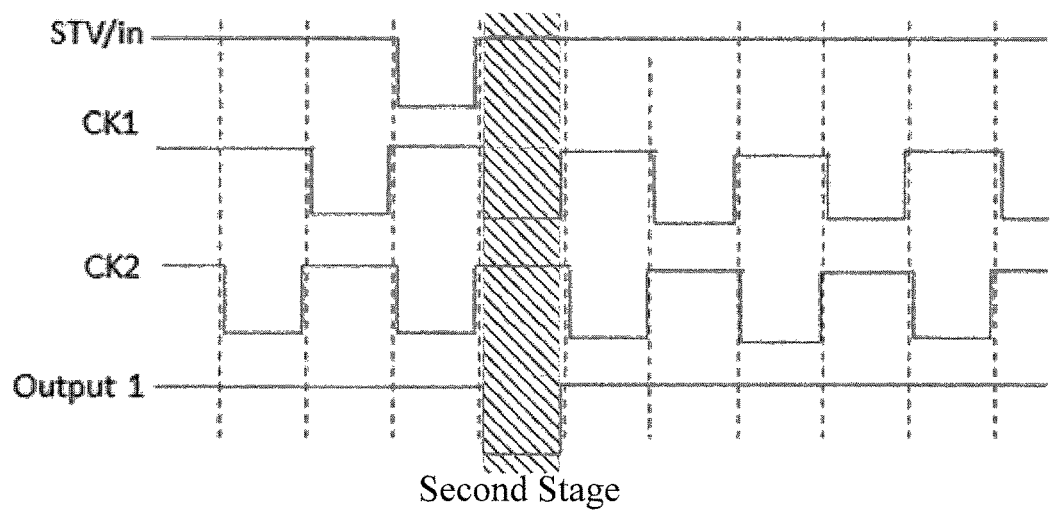
FIG. 7 is a timing waveform diagram corresponding to the circuit diagram of FIG. 6 according to Embodiment 1 of the present disclosure.

A schematic diagram of working principles of the circuit at a second stage and the corresponding timing waveform diagram are respectively illustrated in FIG. 6 and FIG. 7. Working states of the transistors in the circuit and the level states (H represents a high level, and L represents a low level) of the first node n1, the second node n2, the third node n3 and the fourth node n4 are also illustrated in FIG. 6. The working principles of the transistors are the same as the above mentioned contents, which are not described herein any further. At this stage, T2, T3, T4, T9 and T12 are switched on; and in this case, the output signal "out" is of a low level (represented by L), and the waveform Output1 is as illustrated in FIG. 7. Shadow portions in FIG. 7 correspond to levels of the input signal, the clock signals and the output signal at the second stage.

Figure 8:
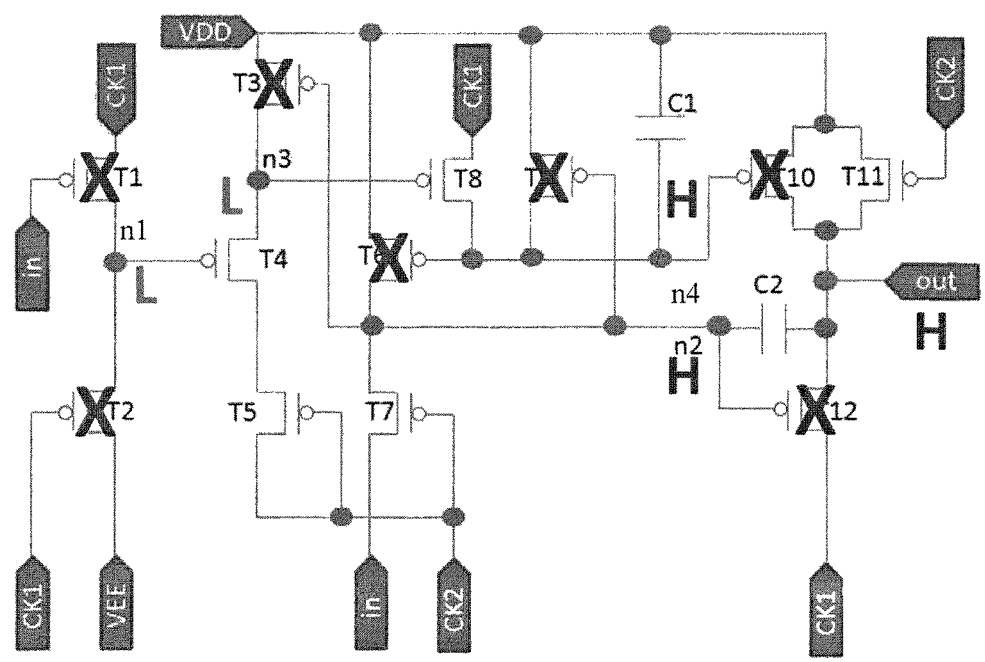
FIG. 8 is a schematic diagram of circuit working principles of the shift register unit working at a third stage according to Embodiment 1 of the present disclosure.
Figure 9:
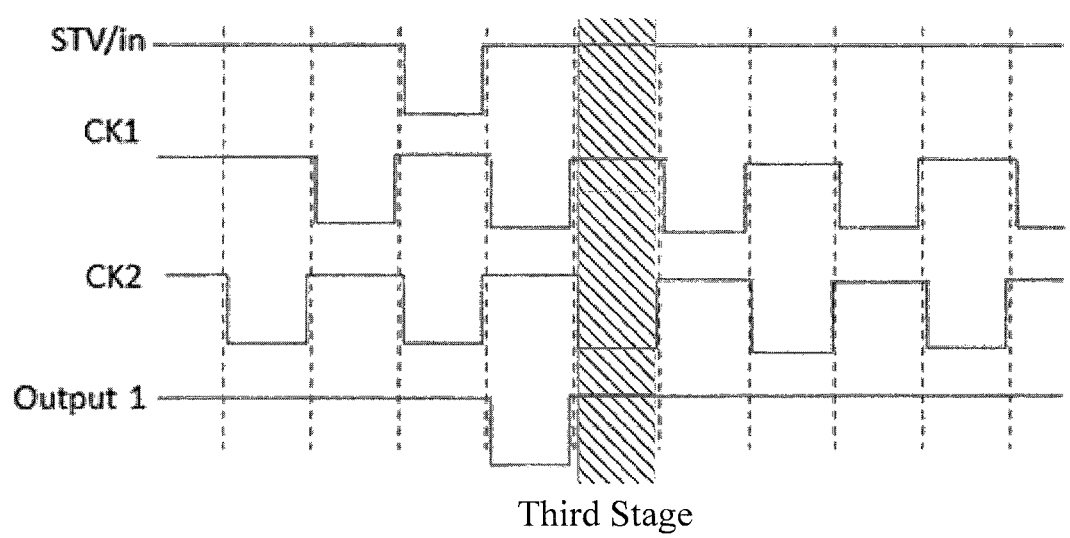
FIG. 9 is a timing waveform diagram corresponding to the circuit diagram of FIG. 8 according to Embodiment 1 of the present disclosure.

A schematic diagram of working principles of the circuit at a third stage and the corresponding timing waveform diagram are respectively illustrated in FIG. 8 and FIG. 9. Working states of the transistors in the circuit and the level states (H represents a high level, and L represents a low level) of the first node n1, the second node n2, the third node n3 and the fourth node n4 are also illustrated in FIG. 8. The working principles of the transistors are the same as the above described working principles, which are not given herein any further. At this stage, T4, T5, T7, T8 and T11 are switched on; and in this case, the output signal "out" is of a high level (represented by H), and the waveform Output1 is as illustrated in FIG. 9. Shadow portions in FIG. 9 correspond to levels of the input signal, the clock signals and the output signal at the third stage.

Figure 10:
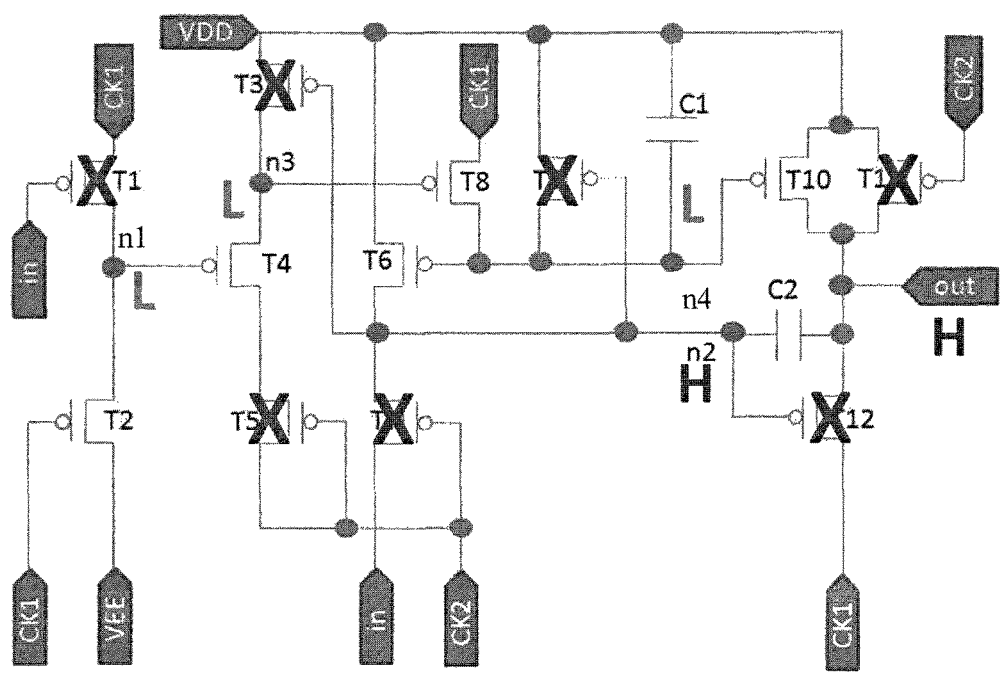
FIG. 10 is a schematic diagram of circuit working principles of the shift register unit working at a fourth stage according to Embodiment 1 of the present disclosure.
Figure 11:
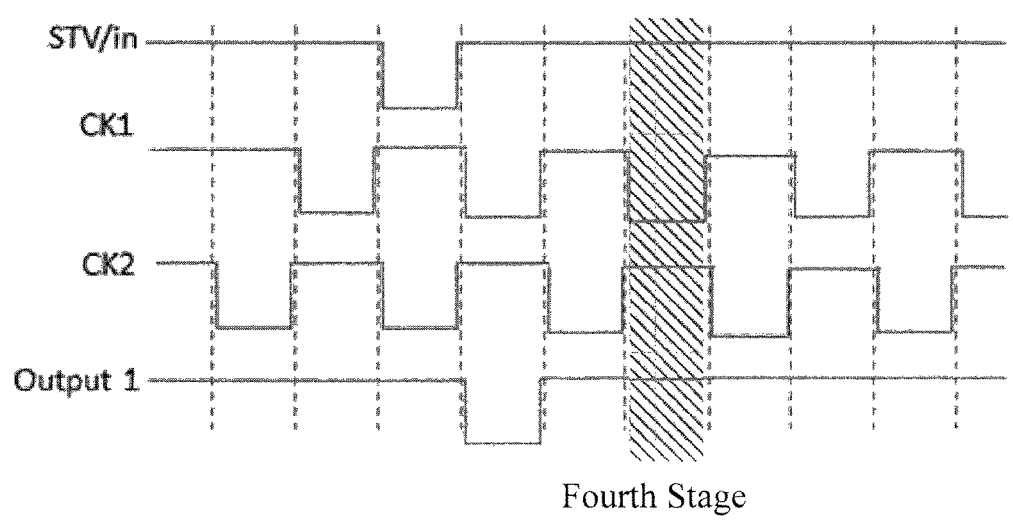
FIG. 11 is a timing waveform diagram corresponding to the circuit diagram of FIG. 10 according to Embodiment 1 of the present disclosure.

A schematic diagram of working principles of the circuit at a fourth stage and the corresponding timing waveform diagram are respectively illustrated in FIG. 10 and FIG. 11. Working states of the transistors in the circuit and the level states (H represents a high level, and L represents a low level) of the first node n1, the second node n2, the third node n3 and the fourth node n4 are also illustrated in FIG. 10. The working principles of the transistors are the same as the above described working principles, which are not given herein any further. At this stage, T2, T4, T6, T8 and T10 are switched on; and in this case, the output signal "out" is of a high level (represented by H), and the waveform Output1 is as illustrated in FIG. 11. Shadow portions in FIG. 11 correspond to levels of the input signal, the clock signals and the output signal at the fourth stage.

Figure 12:
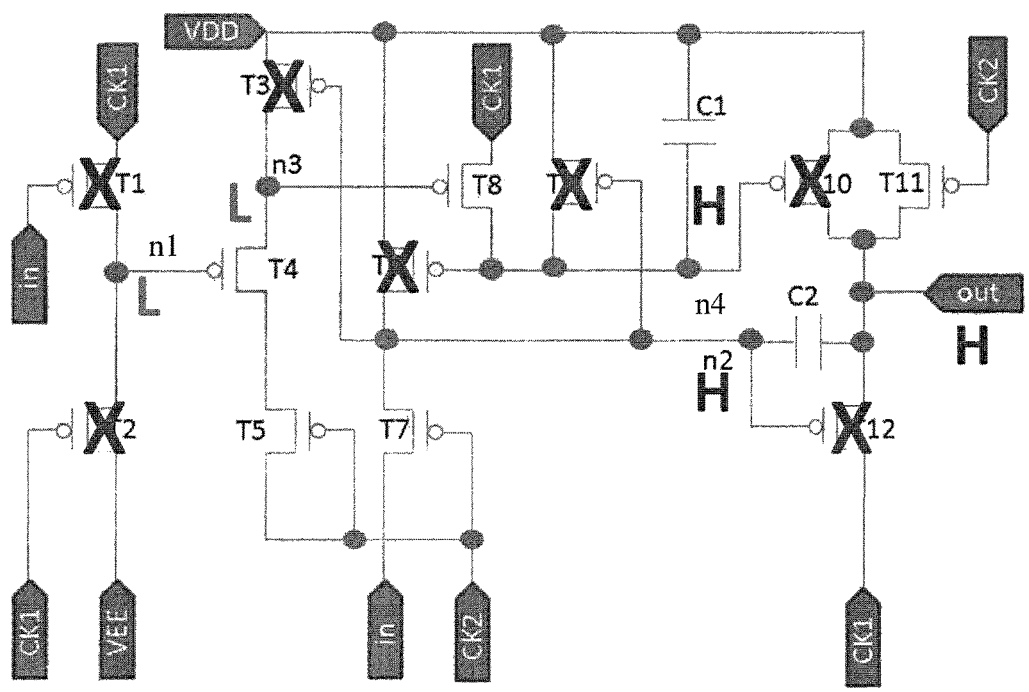
FIG. 12 is a schematic diagram of circuit working principles of the shift register unit working at a fifth stage according to Embodiment 1 of the present disclosure.
Figure 13:
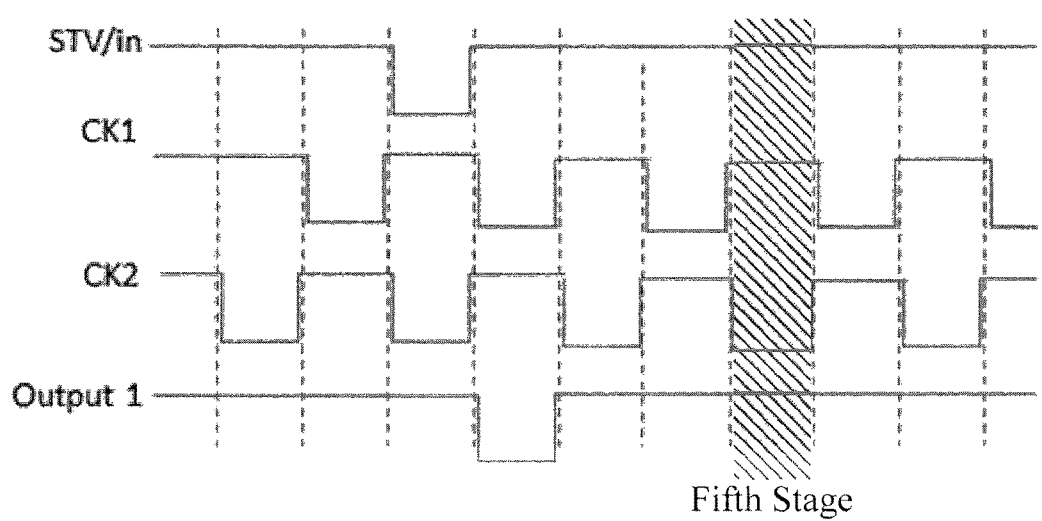
FIG. 13 is a timing waveform diagram corresponding to the circuit diagram of FIG. 12 according to Embodiment 1 of the present disclosure.

A schematic diagram of working principles of the circuit at a fifth stage and the corresponding timing waveform diagram are respectively illustrated in FIG. 12 and FIG. 13. Working states of the transistors in the circuit and the level states (H represents a high level, and L represents a low level) of the first node n1, the second node n2, the third node n3 and the fourth node n4 are also illustrated in FIG. 12. The working principles of the transistors are the same as the above described working principles, which are not given herein any further. At this stage, T4, T5, T7, T8 and T11 are switched on; and in this case, the output signal "out" is of a high level (represented by H), and the waveform Output1 is as illustrated in FIG. 13. Shadow portions in FIG. 13 correspond to levels of the input signal, the clock signals and the output signal at the fifth stage.

In the subsequent timing chart, level changes at the third stage and the fourth stage are sequentially repeated, and stable outputs "out" are ensured. Nevertheless, since the working principles of the circuit at the third stage and the fifth stage are the same and the waveforms generated at these two stages are the same (see FIG. 8 and FIG. 12, FIG. 9 and FIG. 13), so the third stage and the fourth stage may be repeated, or the fourth stage and the fifth stage may be repeated, and there is no essential difference therebetween, both cases may ensure that the output terminal outputs stable signal waveforms.

With the shift register unit according to this embodiment, twelve transistors and two capacitors are used to form a circuit structure; and by using the input start pulse signal and two clock signals having the same cycle but opposite phases, stable waveform signals may be output at the output terminal, and may be used as input signals of a next-stage circuit, thereby finally providing a stable signal waveform.

Embodiment 2

This embodiment provides a gate drive circuit, which includes a plurality of shift register units according to Embodiment 1. The plurality of shift register units are electrically coupled in a cascading manner, wherein an input terminal of a first-level shift register unit is configured to receive a start pulse signal of a low electric level, and a signal of an output terminal of each of the remaining levels of shift register units except for the last-level shift register unit is coupled to an input terminal of a next-level shift register unit.

Figure 14:
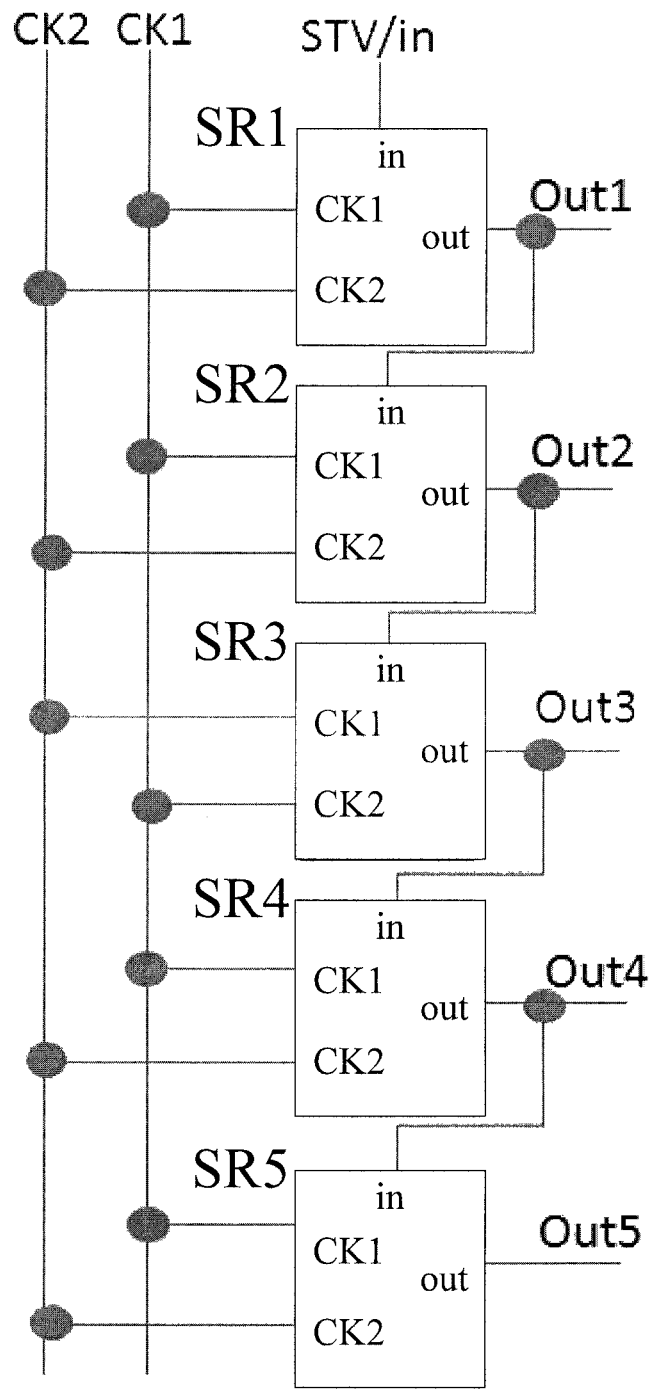
FIG. 14 is a schematic structural diagram of a gate drive circuit according to Embodiment 2 of the present disclosure.
Figure 15:
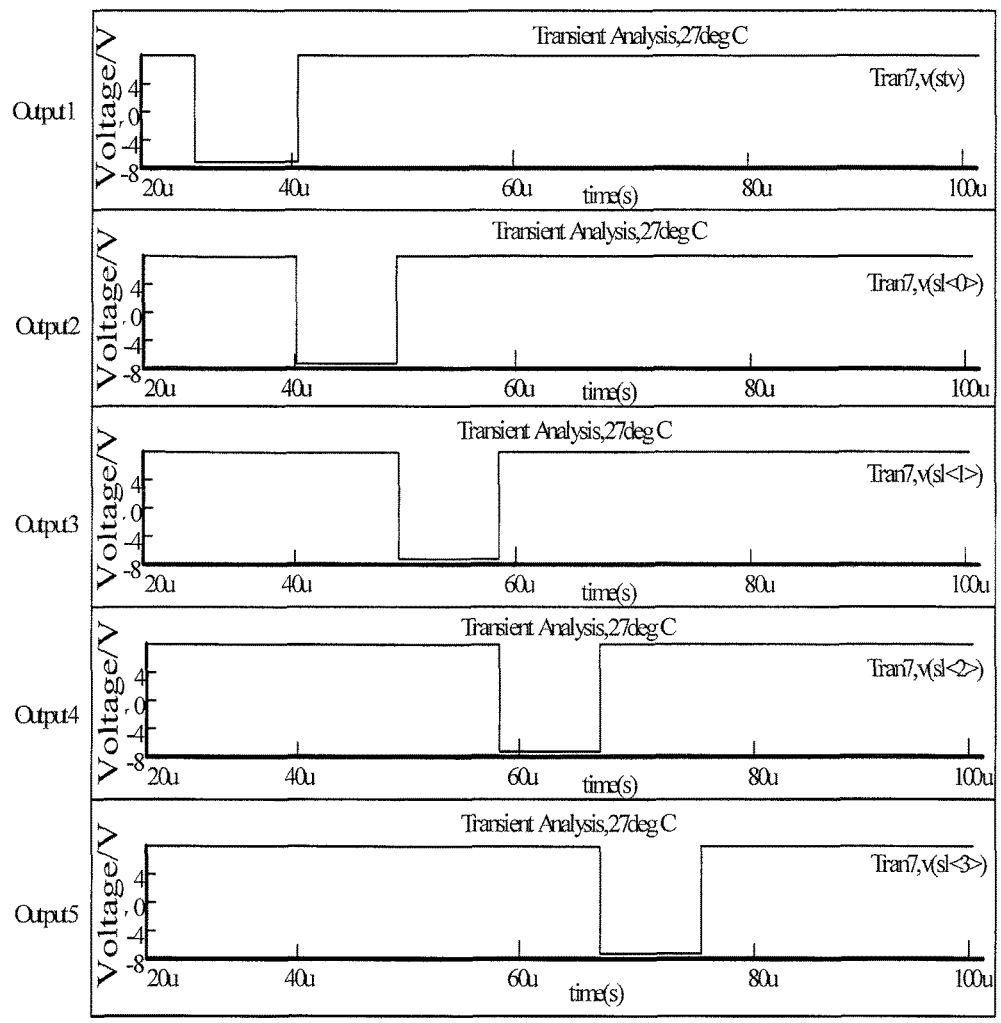
FIG. 15 is a diagram illustrating timing waveforms output by various levels of shift register units in the gate drive circuit of FIG. 14.

As illustrated in FIG. 14, in this embodiment, using five cascaded shift register units as an example, an output signal Out1 of the first-level shift register unit SR1 is used as an input signal in of a second-level shift register unit, and an output signal Out2 of the second-level shift register unit SR2 is used as an input signal in of a third-level shift register unit, . . . . In this way, after a start pulse signal with a low electric level is input at an input terminal of the first-level shift register unit SR1, a stable output signal Out may be generated at an output terminal of the first-level shift register unit SR1, and the output signal Out is input to an input terminal of the second-level shift register unit SR2, . . . and so on. The output signals Out1, Out2, Out3, Out4 and Out5 are respectively acquired at output terminals of the fifth levels of shift register units, and final output waveforms Output1, Output2, Output3, Output4 and Output5 are respectively illustrated in FIG. 15. It is capable of outputting stable signals in shift registers.

This embodiment may achieve the same technical effect as Embodiment 1, which is thus not described herein any further.

Embodiment 3

This embodiment provides a display device, which includes a gate drive circuit as described above. Gate scanning lines of the display device are enabled row-by-row via signals output by the shift register. The display device further includes a source drive circuit, which is configured to provide a data voltage to corresponding pixels when the gate scanning line is enabled.

This embodiment may also achieve the same technical effect as Embodiment 1, which is thus not described herein any further.

A person skilled in the art would be aware that various modifications and variations made without departing from the spirit and scope disclosed by the appended claims of the present disclosure shall fall within the protection scope defined by the claims of the present disclosure.

What is claimed is:

1. A shift register unit, comprising:
   a first switch element, configured to switch on in response to an input signal to provide a first clock signal to a first node;
   a second switch element, configured to switch on in response to the first clock signal to provide a first power signal to the first node;
   a third switch element, coupled to a second node, and configured to switch on in response to a signal of the second node to provide a second power signal to a third node;
   a fourth switch element, coupled to the first node, and configured to switch on in response to a signal of the first node;
   a fifth switch element, configured to switch on in response to a second clock signal, and coupled to the fourth switch element;
   a sixth switch element, coupled to a fourth node, and configured to switch on in response to a signal of the fourth node to provide the second power signal to the second node;
   a seventh switch element, configured to switch on in response to the second clock signal to provide the input signal to the second node;
   an eighth switch element, coupled to the third node, and configured to switch on in response to a signal of the third node to provide the first clock signal to the fourth node;
   a ninth switch element, coupled to the second node, and configured to switch on in response to the signal of the second node to provide the second power signal to the fourth node;
   a tenth switch element, coupled to the fourth node, and configured to switch on in response to a signal of the fourth node to provide the second power signal to an output terminal;
   an eleventh switch element, configured to switch on in response to the second clock signal to provide the second power signal to the output terminal;
   a twelfth switch element, coupled to the second node, and configured to switch on in response to the signal of the second node to provide the first clock signal to the output terminal;
   a first capacitor, coupled between the second power signal and the fourth node; and
   a second capacitor, coupled between the second node and the output terminal.

2. The shift register unit according to claim 1, wherein the first to twelfth switch elements are respectively first to twelfth transistors.

3. The shift register unit according to claim 2, wherein each of the first to twelfth transistors has a control terminal, a first terminal and a second terminal;
   the control terminal of the first transistor is configured to receive the input signal, the first terminal of the first transistor is configured to receive the first clock signal, and the second terminal of the first transistor is coupled to the first node;
   the control terminal of the second transistor is configured to receive the first clock signal, the first terminal of the second transistor is coupled to the second terminal of the first transistor, and the second terminal of the second transistor is configured to receive the first power signal;
   the control terminal of the third transistor is coupled to the second node, the first terminal of the third transistor is configured to receive the second power signal, and the second terminal of the third transistor is coupled to the third node;

the control terminal of the fourth transistor is coupled to the first node, and the first terminal of the fourth transistor is coupled to the third node;

the control terminal of the fifth transistor and the second terminal of the fifth transistor are both coupled to the second clock signal, and the first terminal of the fifth transistor is coupled to the second terminal of the fourth transistor;

the control terminal of the sixth transistor is coupled to the fourth node, the first terminal of the sixth transistor is configured to receive the second power signal, and the second terminal of the sixth transistor is coupled to the second node;

the control terminal of the seventh transistor is configured to receive the second clock signal, the first terminal of the seventh transistor is coupled to the second node, and the second terminal of the seventh transistor is configured to receive the input signal;

the control terminal of the eighth transistor is coupled to the third node, the first terminal of the eighth transistor is configured to receive the first clock signal, and the second terminal of the eighth transistor is coupled to the fourth node;

the control terminal of the ninth transistor is coupled to the second node, the first terminal of the ninth transistor is configured to receive the second power signal, and the second terminal of the ninth transistor is coupled to the fourth node;

the control terminal of the tenth transistor is coupled to the fourth node, the first terminal of the tenth transistor is configured to receive the second power signal, and the second terminal of the tenth transistor is coupled to the output terminal;

the control terminal of the eleventh transistor is configured to receive the second clock signal, the first terminal of the eleventh transistor is configured to receive the second power signal, and the second terminal of the eleventh transistor is coupled to the output terminal; and the control terminal of the twelfth transistor is coupled to the second node, the first terminal of the twelfth transistor is coupled to the output terminal, and the second terminal of the twelfth transistor is configured to receive the first clock signal.

4. The shift register unit according to claim 3, wherein each of the first to twelfth transistors is a PMOS transistor.

5. The shift register unit according to claim 3, wherein the first clock signal and the second clock signal have the same cycle but have opposite phases.

6. The shift register unit according to claim 3, wherein the first power signal is of a low level, and the second power signal is of a high level.

7. The shift register unit according to claim 3, wherein the input signal is a start pulse signal with a low electric level.

8. A gate drive circuit, comprising a plurality of shift register units according to claim 1.

9. The gate drive circuit according to claim 8, wherein the plurality of shift register units are electrically coupled in a cascading manner, wherein an input terminal of a first-level shift register unit is configured to receive a start pulse signal, and a signal of an output terminal of each of the remaining levels of shift register units except for the last-level shift register unit is coupled to an input terminal of a next-level shift register unit.

10. A display device, comprising a gate drive circuit which comprises a plurality of shift register units according to claim 1.

11. The display device according to claim 10, wherein the plurality of shift register units are electrically coupled in a cascading manner, wherein an input terminal of a first-level shift register unit is configured to receive a start pulse signal, and a signal of an output terminal of each of the remaining levels of shift register units except for the last-level shift register unit is coupled to an input terminal of a next-level shift register unit.

* * * * *